United States Patent [19]

Moustakas

[11] 4,285,762
[45] Aug. 25, 1981

[54] PLASMA ETCHING OF AMORPHOUS SILICON (SE-35)

[75] Inventor: Theodore D. Moustakas, Berkeley Heights, N.J.

[73] Assignee: Exxon Research & Engineering Co., Florham Park, N.J.

[21] Appl. No.: 108,417

[22] Filed: Dec. 31, 1979

[51] Int. Cl.$^3$ .......................................... H01L 21/306
[52] U.S. Cl. .................................... 156/643; 156/646; 156/657; 156/662; 204/192 E; 252/79.1
[58] Field of Search ............ 204/143, 192 EC, 192 E, 204/298; 156/643, 646, 657, 662; 252/79.1

[56] References Cited
U.S. PATENT DOCUMENTS

| | | | |
|---|---|---|---|
| 3,743,847 | 7/1973 | Boland | 156/657 X |
| 4,151,058 | 4/1979 | Kaplan et al. | 204/192 S |
| 4,217,393 | 8/1980 | Staebler et al. | 156/643 X |

Primary Examiner—William A. Powell
Attorney, Agent, or Firm—Paul E. Purwin

[57] ABSTRACT

Amorphous silicon is selectively etched by concurrently exposing the silicon to a ionized plasma containing hydrogen and heating the silicon to a temperature of between about 150° C. to about 350° C. In one embodiment the selective etching technique is utilized to texture the surface of the amorphous silicon reducing the reflectivity thereof to less then about 5%.

10 Claims, 1 Drawing Figure

PLASMA ETCHING OF AMORPHOUS SILICON (SE-35)

BACKGROUND OF THE INVENTION

Amorphous silicon thin films are projected for use in diverse semiconductor applications. A high degree of photoconductivity makes this material ideally suited for photo-electric applications such as solar cells, photodetectors and the like. In thin film form, material costs for this semiconductor are sufficiently low to also allow its use in non-electronic applications such as solar thermal collectors or other applications utilizing the material characteristics of this semiconductor.

The efficiency of virtually all photo applications of amorphous silicon is dependent upon the incident photon entering into and being absorbed within the material. Absorption characteristics of bulk amorphous silicon are an inherent material property which cannot be significantly altered without altering other semiconductor properties. However, a percentage of incident photo flux may also be lost by reflection from the surface of the material. In general, reflection of incident light is a significant efficiency influencing factor in photo devices. For instance, when radiation is incident along a normal to an interface between two dielectric materials, one non-absorbing and the second absorbing, the ratio of the reflected to incident energy is calculable as:

$$R = \left( \frac{n - n'}{n + n'} \right)^2$$

where n is the refractive index of the first medium and n' is the refractive index of the second medium.

The bandgap of amorphous silicon varies relative to the amount of hydrogen within the film, resulting in a variance in the refractive index, n', from about 3.0 ev to about 3.5 ev (at $\lambda = 2.0$ microns). The refractive index is also dispersive with energy, evidencing a relatively constant value for $\lambda$ ranging from 2.0 microns to 1.0 microns, monotonically increasing to about 0.5 microns and decreasing thereafter. However, using an average value of n', an interface between air (having a value of $n' \approx 1$) and amorphous silicon results in the reflection of approximately 35% to 45% of incident light energy.

Unlike absorption, there exists a variety of alternate techniques for reducing the reflectivity of surfaces. Semiconductor applications commonly employ an antireflection coating comprising a layer of generally transparent material having an optical index of refraction and layer thickness designed according to the expression:

$$n_1 d_1 = (2x - 1)\lambda/4$$

$$n_1 = (n_0 n_2)$$

where $n_1$ is the refractive index of the anti-reflection coating deposited onto a dielectric of index $n_2$; x is an integer, $\lambda$ is the wavelength of the incident radiation and $n_o$ is the refractive index of the incident medium (typically air with a $n_0 \approx 1$.)

Although this technique is effective, it adds to the cost and complexity of the completed device. Furthermore, these anti-reflection coatings do not provide a "flat" or constant reduced reflectivity but are wavelength dependent. They are also critically dependent on controlled layer thickness.

An alternate technique is to texture or roughen the reflecting surface. This general technique may be divided into two categories, multiple internally reflective surfaces and gradient transition surfaces. The distinction between these two is physically one of size of the texturing, but phenomenalogically the two surfaces involve wholly distinct optical properties. The present invention relates generally to this latter category, this is, graded textured surfaces. Herein disclosed is a method for etching amorphous silicon in a hydrogen containing plasma to provide sub-micron dimensioning. In one embodiment, the geometry of the average etched cavity is of the same order of magnitude as the wavelength of incident light. An incident packet of light energy evidences a graded transition from a first optical medium (air for example) to the second medium, amorphous silicon. The graded transition reduces the reflectivity of the surface of amorphous silicon to below about 5%. Embodied in a photo-device such as a solar cell, the reduction in reflection losses from $\approx 40\%$ to below about 5% correspondingly increases the efficiency of the device.

1. Field of the Invention

The present invention relates to amorphous silicon and more particularly to a method for plasma etching amorphous silicon surfaces to reduce its reflectivity of light energy.

2. Prior Art

The concept of reduced reflectivity textured surfaces is known in the art. Needle-like microstructures are typically either grown onto or etched into semiconductor surfaces by chemical treatments. Numerous techniques are known for forming these microstructures on semiconductor materials such as crystalline silicon and germanium.

Also known in the art are numerous techniques for producing amorphous silicon. Photoconductive amorphous silicon is generally produced by plasma decomposition of silane or, alternatively, by sputtering in a plasma containing argon and hydrogen. As noted heretofore, the conventionally deposited amorphous silicon film has a surface reflectivity of about 40%. The present invention teaches a method for micro-texturing this reflective surface by etching the amorphous silicon surface in a hydrogen containing plasma. In U.S. Pat. No. 4,151,058, Kaplan et al have treated amorphous silicon films in a hydrogen plasma to incorporate hydrogen into the silicon film. The method taught therein is directed to producing photoconductivity in the previously un-hydrogenated films. In contrast, the present invention does not diffuse hydrogen into the amorphous silicon film but operates to etch the silicon.

SUMMARY OF THE INVENTION

Reflective losses of conventionally deposited amorphous silicon are typically about 40%. The present invention teaches a post-deposition treatment of the amorphous silicon film to reduce the reflectivity to below about 5%. A method for etching amorphous silicon includes exposing the film to an ionized plasma containing hydrogen. The etching process may be used to provide a micro-textured surface wherein etched cavities have an average inter-cavity spacing of the order of the wavelength of visible light. Incident light energy evidences a gradient transition from a first transport medium (air for example) to a second absorbing medium, resulting in a decreased reflectivity of the textured surface.

BRIEF DESCRIPTION OF THE DRAWINGS

The FIGURE is a graphic plot of reflectance versus wavelength for two amorphous silicon surfaces, an untreated surface, and a surface treated in accordance with the present invention.

DETAILED DESCRIPTION OF THE INVENTION

Figure 1:
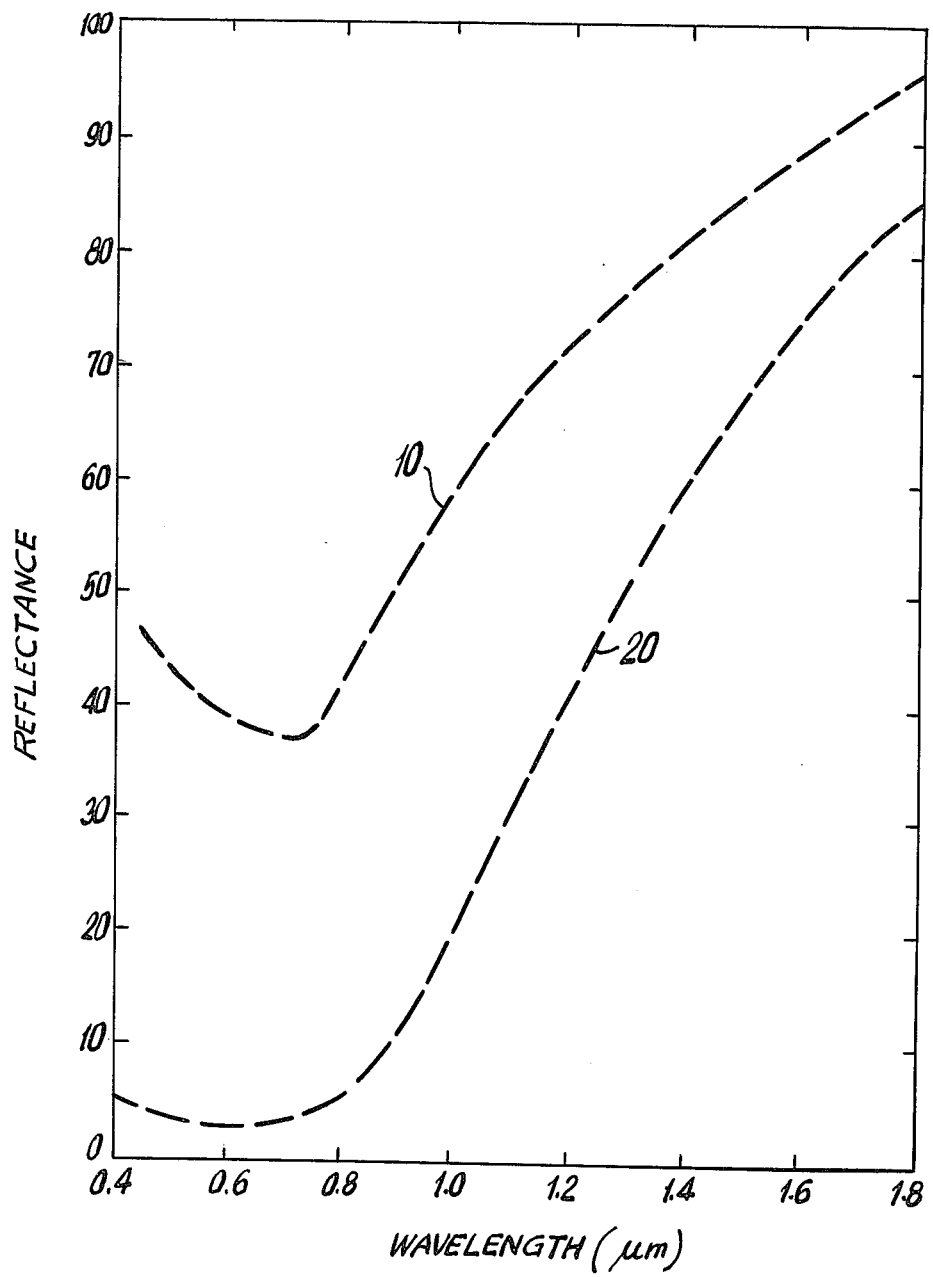

The process taught by the present invention includes providing a layer of amorphous silicon. Known to those in the art, amorphous silicon may be hydrogenated to produce a photoconductive semiconductor. In the absence of intentionally incorporated hydrogen, the material is generally not photoconductive, however, it retains its bandgap absorbtion characteristic making it useful for selective absorber coatings or the like. Both types of amorphous silicon are contemplated in the practice of the present invention, having use in either electronic, opto-electronic, or non-electronic optical applications. Photoconductive amorphous silicon is generally characterized as containing an amount of hydrogen, typically incorporated during the formation of the semiconductor film. As presently understood, this incorporated hydrogen is bonded to the silicon in one or more of monohydride SiH, isolated or conjugated dihydride $SiH_2$ or higher order polyhydride $SiH_x$ forms. For purposes of the present invention, amorphous silicon will define a layer of either hydrogenated or non-hydrogenated amorphous silicon produced by any of a number of means. General examples of these means includes plasma decomposition of silane, sputtering, thermal decomposition of silane or the like. The amorphous silicon films generally appear deep red in color and have a smooth glassy surface when deposited on smooth substrates such as glass, quartz sapphire or the like. Referring momentarily to FIG. 1, an analysis of the reflective characteristics of a conventionally deposited amorphous silicon film are illustrated by trace 10. An average reflectivity of about 40% through the visible spectral region from 0.4 microns to about 0.8 microns is normally evidenced for films deposited on relatively smooth substrates. Increasing reflectivity above (at λ greater than) 0.8 microns is the reflection of the underlying metallic coating of the substrate.

The amorphous silicon films is then subjected to the plasma etching process of the present invention. The amorphous silicon films are placed in a conventional sputtering apparatus which is adapted to provide a controlled partial pressure of hydrogen. In a preferred embodiment, film deposition and etching is accomplished in a single system without exposing the film to oxygen before etching. Natural oxidation (SiOx) of the film is thereby minimized which would otherwise decrease the etching rate through such an oxide layer. The amorphous silicon films, typically on supportive substrates, are secured to an anode electrode which has been modified to include heating and voltage biasing means. Simple mechanical securing means are used to assure electrical and thermal contact between the anode electrode and the silicon film.

The sputtering apparatus is vacuum evacuated to a pressure below about $10^{-5}$ torr or lower and then backfilled to a predetermined partial pressure of hydrogen. To insure removal of residual atmospheric gases, the system may be reevacuated and purged with argon, again evacuated, and backfilled to an appropriate partial pressure of hydrogen. As discussed hereinafter, the partial pressure of hydrogen will influence the etching rate, however the range of hydrogen partial pressures and more particularly the lower limit of this range will be determined by the particular plasma apparatus used. In a radio frequency (hereinafter RF) capacitively coupled sputtering apparatus having 126 $cm^2$ area electrodes and an inter electrode spacing of about 5 cm, a hydrogen partial pressure range from about 75 millitorr to about 100 millitorr has been shown operable in the present invention. The upper pressure limit is dependent upon the pumping capability of the vacuum system employed. In a preferred embodiment, the evacuated sputtering system is backfilled with hydrogen to a pressure of about 90 millitorr.

The film is then heated to a temperature ranging from about 150° C. to 350° C. The etching rate has been demonstrated to be a function of the temperature at which the films are maintained, empirically demonstrating reduced etching rates when the film temperature approachs both the upper and lower temperature range. Above 350° C. etching of the silicon is virtually eliminated. A preferred temperature range of about 200° C. to 275° C. is believed optimal in providing an enhanced etching rate. A further preferred embodiment includes providing a positive voltage bias ranging from about 50 volts to about 100 volts to the amorphous silicon films in addition to heating the films. It is believed that the bias voltage assists in the liberation of species from the silicon surface by enhanced electron bombardment. Once the film temperature is stabilized, the gas content of the system in the region proximate to the anode and cathode electrodes, which is principally hydrogen, is ionized to produce a hydrogen plasma. In one embodiment, the anode and cathode electrodes capacitively couple R.F. energy ranging from about 1 watts/$cm^2$ to about 2 watts/$cm^2$ to the hydrogen gas. The plasma both ionizes and dissociates the hydrogen to yield ionized atomic hydrogen. As presently understood, the exposure of the hydrogenated amorphous silicon surface to the hydrogen plasma produces a volatile silicon/hydrogen product such as silane ($SiH_4$) which is pumped out of the system by the continual vacuum pumping during the etching process. A sufficient temperature range of the amorphous silicon film is believed necessary. As presently understood the mobility of the hydrogen atom is temperature dependent and a low temperature reduces the probability of sufficiently forming the volatile gas product, resulting in low etching rates. At high temperature, the mobility of the hydrogen proximate to the silicon film is exceedingly high also decreasing the probability of forming the volatile product. Increased etching rates are evidenced at an intermediate film temperature of about 275° C., heretofore recited as a preferred film temperature range where sufficient hydrogen mobility increases the probability of forming a volatile hydrogen/silicon product. In a preferred embodiment, film deposition and etching is accomplished in a single system, without exposing the film to oxygen before etching. Natural oxidation (SiOx) of the film is thereby minimized which would otherwise decrease the etching rate through such an oxide layer.

In one embodiment, the aforedescribed etching process is continued for a period ranging from about 1 hour to about 5 hours to produce a microscopically textured surface on the amorphous silicon film. The texturing is in the form of cavities etched into the silicon film. An average cavity spacing, D, as revealed by electron micrographs is less than the wavelength of light to be absorbed and generally less than 1.0 micron. A cavity depth of greater than about 6000 Å is also evidenced. In a preferred embodiment, an average cavity spacing of between about 1000 Å and 3000 Å provides a substantial reduction in the reflectivity of visible wavelength light from the surface of the amorphous silicon. The microscopic cavities having intercavity dimensioning of the order of, or less than the wavelength of incident light energy provides a gradient transition from a first, transparent media (air for example) to a second media of amorphous silicon. This gradient transition reduces the surface's reflectivity for light energy incident at virtually all angles, including angles substantially differing from the perpendicular to the plane of the silicon surface. An analysis of the reflectivity of this surface for visible and near infra-red light is illustrated in trace 20 of FIG. 1, shown in comparison to an unetched surface, trace 10, described heretofore. The increased reflectivity at wavelengths beyond 0.8 microns is due to the reflection of the underlying metallic layer since the amorphous silicon is transparent at these wavelengths. The textured amorphous silicon surface evidences an average reflectivity less than about 5.0% throughout the spectral region from 0.4 microns to about 0.8 microns. The reflectivity measurements were repeated at angles substantially differing from the perpendicular to the surface plane, however no significant increase in reflectivity was noted.

Although the apparatus for hydrogen plasma etching process is described herein as a modified sputtering apparatus, those of the art readily recognize that numerous plasma or glow discharge systems may be substituted, these clearly being within the scope of the presently claimed invention. To further assist one skilled in the art in the practice of the present invention, the following example details a specific embodiment of the hereinafter claimed invention.

EXAMPLE 1

A plurality of borosilicate glass substrates were placed in a conventional sputtering apparatus where a 1000 Å layer of nichrome was sputter deposited onto the glass substrates. These metal coated substrates were then transferred to a sputtering apparatus which was modified to provide controlled partial pressures of hydrogen and argon.

The substrates were secured to an anode electrode modified to provide both controlled substrate heating and voltage biasing. The sputtering system was evacuated to a vacuum of about $10^{-7}$ torr, backfilled with high purity argon, and reevacuated to high vacuum. A partial pressure of argon, being equal to about 15 millitorr was maintained controlling the gas entry flow rate and suitably throttling the pumping speed of the vacuum system. The substrates were then heated to and maintained at a temperature of about 275° C., and concurrently biased to about +50 volts; a technique believed to produce more homogeneous, denser films, containing less argon. Conventional sputtering proceeded by coupling 200 watts of RF energy to the hydrogen/argon atmosphere through a 5 inch diameter polycrystalline silicon anode electrode and a similarly dimensioned cathode electrode. A total film thickness of about 1.5 microns of amorphous silicon was deposited in about 2 hours. The argon supply was then deleted and the system backfilled with a partial pressure of hydrogen about equal to 90 millitorr. The substrates were maintained at 275° C. and biased with a positive voltage of about 50 volts. A hydrogen plasma was formed by coupling 100 watts of RF energy to the hydrogen gas content through the aforedescribed anode and cathode electrodes. The hydrogen plasma treatment of the films continued for a period of about four hours, whereafter the etched films were analyzed in comparison to unetched films which were produced in a similar manner. The unetched film appeared glassy reddish brown viewing the film from the perpendicular to the surface. Increasingly acute angles of observance evidenced a change in appearance toward a silvery or metallic appearance. The etched films in contrast, appeared black from virtually all angles of observance. The reflection characteristics were then examined in a Bechman Model #DK1A Spectrophotometer, fitted with an intergrating sphere which permitted a measurement of total hemispherical reflectivity. Illustrated in FIG. 1, the unetched surface, here shown at trace 10, evidenced an average hemispherical reflectivity of about 45% through the visible spectral region of 0.4 microns to about 0.8 microns. In contrast, the reflectivity of the etched surfaced, here collectively shown at trace 20, evidenced an average hemispherical reflectivity of less than about 5%. The surface of the etched samples were then examined under an electron microscope. Normal surface scans revealed an average intercavity spacing of between about 1000 angstroms and about 3000 angstroms.

EXAMPLE 2

The procedure followed for Example 2 is identical to that of Example 1 except that hydrogenated photoconductive amorphous silicon was sputter deposited by sputtering the film in partial pressures of $\approx 0.5$ mTorr of hydrogen and 15 mTorr of argon.

A spectral reflectivity analysis of the etched film demonstrated an average hemispherical reflectivity of about 5% from 0.4 to about 0.8 microns.

What is claimed is:

1. A method for selectively etching amorphous silicon comprising:
   (a) depositing a layer of amorphous silicon into a substrate;
   (b) heating said layer to a temperature between about 150° C. and about 350° C. and concurrently exposing said silicon layer to an ionized plasma containing hydrogen wherein the exposed silicon is etched.

2. The method of claim 1 wherein said hydrogen containing plasma is further characterized as electral ionizing energy capacitively coupled to a gaseous mixture of hydrogen and argon.

3. The method of claim 2 wherein said gaseous mixture comprises a partial pressure of hydrogen ranging from about 75 millitorr to about 100 millitorr.

4. The method of claim 3 wherein said partial pressure of hydrogen is about 90 millitorr.

5. The method of claim 3 or 4 wherein said silicon film is maintained at a temperature of between about 200° C. and about 275° C.

6. The method of claim 6 wherein said ionizing energy comprises between about 1 watt/cm$^2$ and about 2 watts/cm$^2$ of alternating current voltage.

7. The method of claim 6 wherein a positive voltage bias of between about 50 volts and about 100 volts is applied to said substrate during the etching of the silicon layer.

8. The method of claim 1 wherein a surface of said silicon is etched to provide a textured surface which is characterized as having cavities in said surface having an average inter-cavity spacing less than about one micron and an average cavity depth of greater than about 6000 Å.

9. The method of claim 9 wherein said average inter-cavity spacing is between about 1000 Å and about 3000 Å.

10. A method for reducing the reflectivity of amorphous silicon comprising etching a surface region of a layer of amorphous silicon in an ionized plasma containing a partial pressure of about 90 mTorr of hydrogen wherein said surface region is etched to form cavities, said cavities having an average inter-cavity spacing between about 1000 Å and about 3000 Å and wherein light energy having a wavelength ranging from 0.4 microns to about 0.8 microns incident upon said textured surface experiences a graded transition from a first transparent medium to a second absorbing medium, substantially reducing the reflectivity of said light energy from the silicon surface.

* * * * *